United States Patent [19]

Fernandez

[11] Patent Number: 5,405,659
[45] Date of Patent: Apr. 11, 1995

[54] METHOD AND APPARATUS FOR REMOVING MATERIAL FROM A TARGET BY USE OF A RING-SHAPED ELLIPTICAL LASER BEAM AND DEPOSITING THE MATERIAL ONTO A SUBSTRATE

[75] Inventor: Felix E. Fernandez, Mayaguez, Puerto Rico

[73] Assignee: University of Puerto Rico, San Juan, Puerto Rico

[21] Appl. No.: 27,191

[22] Filed: Mar. 5, 1993

[51] Int. Cl.⁶ .............................................. C23C 14/28
[52] U.S. Cl. .................................. 427/596; 427/597; 118/50.1; 118/620; 118/726
[58] Field of Search ..................... 427/561, 596, 597; 204/192.24, 298.02; 219/121.65, 121.66, 121.68, 121.69; 118/50.1, 620, 726; 359/709

[56] References Cited

U.S. PATENT DOCUMENTS

| | | | |
|---|---|---|---|
| 4,059,461 | 11/1977 | Fan et al. | 148/1.5 |
| 4,151,008 | 4/1979 | Kirkpatrick | 148/1.5 |
| 4,271,347 | 6/1981 | Svenson | 219/121 |
| 4,281,030 | 7/1981 | Silfvast | 427/42 |
| 4,308,078 | 12/1981 | Cook | 148/1.5 |
| 4,309,225 | 1/1982 | Fan et al. | 148/1.5 |
| 4,466,179 | 8/1984 | Kasten | 29/576 |
| 4,543,270 | 9/1985 | Oprysko et al. | 427/53.1 |
| 4,592,975 | 6/1986 | Young et al. | 430/5 |
| 4,606,932 | 8/1986 | Oprysko et al. | 427/53.1 |
| 4,615,904 | 10/1986 | Ehrlich et al. | 427/38 |
| 4,701,592 | 10/1987 | Cheung | 219/121 |
| 4,719,183 | 1/1988 | Maekawa | 437/19 |
| 4,786,358 | 11/1988 | Yamazaki et al. | 156/643 |
| 4,837,044 | 1/1989 | Murarka et al. | 427/10 |
| 4,892,751 | 1/1990 | Miyake et al. | 427/34 |
| 4,964,967 | 10/1990 | Hashimoto et al. | 204/292 |
| 4,970,196 | 11/1990 | Kim et al. | 505/1 |
| 4,987,007 | 1/1991 | Wagal et al. | 427/53.1 |
| 5,049,405 | 9/1991 | Cheung | 118/726 |
| 5,084,300 | 1/1992 | Zander et al. | 118/50.1 |
| 5,191,591 | 3/1993 | Okamoto et al. | 372/101 |
| 5,264,412 | 11/1993 | Ota et al. | 427/596 |

FOREIGN PATENT DOCUMENTS

| | | | |
|---|---|---|---|
| 219508A | 3/1985 | Germany | 427/597 |
| 296381A | 11/1991 | Germany | 427/597 |
| 1-319673 | 12/1989 | Japan . | |

OTHER PUBLICATIONS

Grimm, M. A., "Optical System for Laser Machining of Narrow Slots", IBM Technical Disclosure Bulletin, vol. 14, No. 9 (Feb. 1972) pp. 2641–2642.

*Primary Examiner*—Terry J. Owens
*Attorney, Agent, or Firm*—Bell, Seltzer, Park & Gibson

[57] ABSTRACT

Method and apparatus for depositing a thin layer of a target material onto a substrate by illuminating the target material with at least one ring-shaped elliptical laser beam so that a ring-shaped deposition plume is emitted from the target material, and positioning the substrate to receive the emitted material. Concentric, ring-shaped elliptical laser beams are formed by use of a multi-faceted negative axicon.

22 Claims, 9 Drawing Sheets

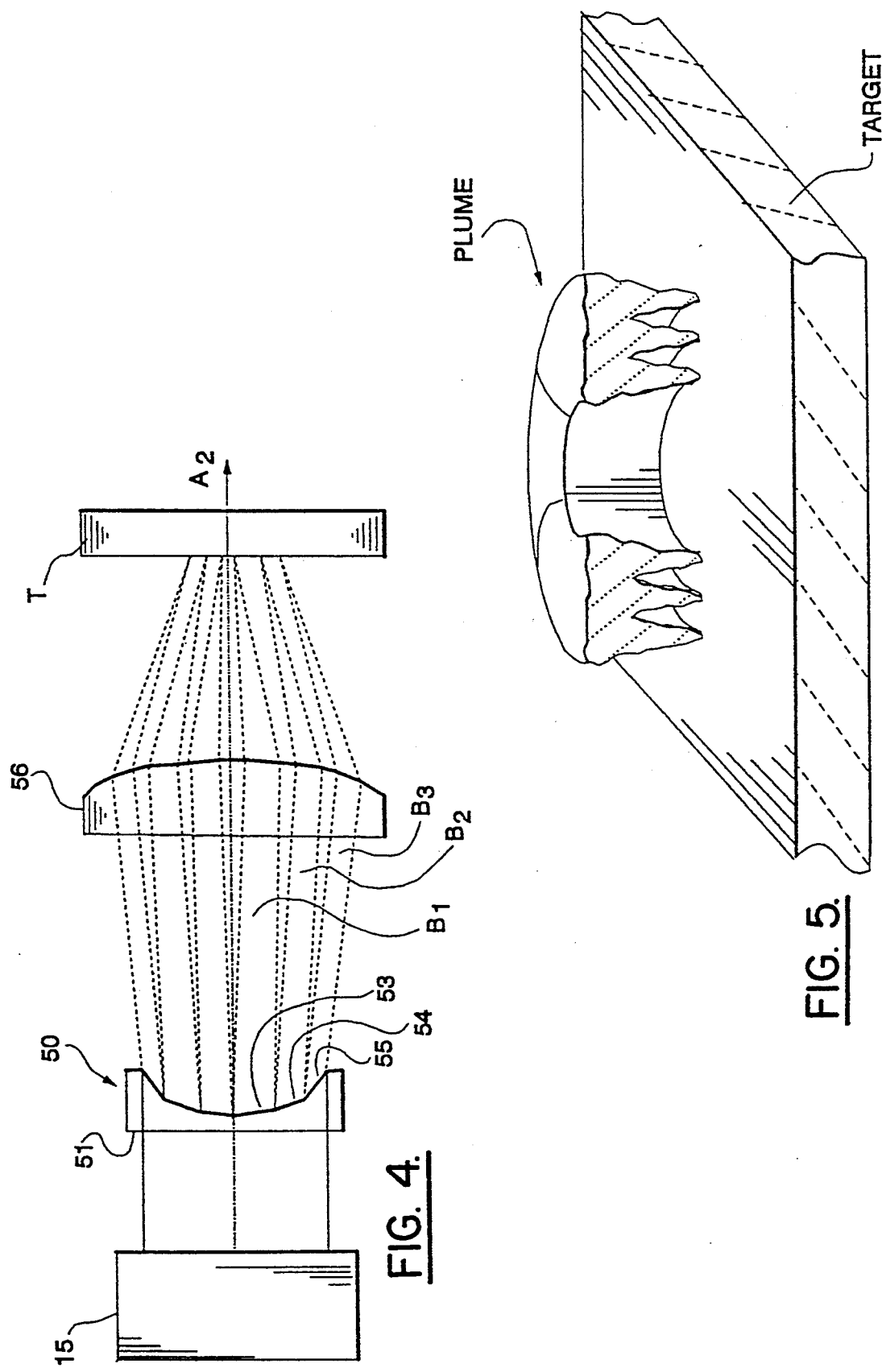

METHOD AND APPARATUS FOR REMOVING MATERIAL FROM A TARGET BY USE OF A RING-SHAPED ELLIPTICAL LASER BEAM AND DEPOSITING THE MATERIAL ONTO A SUBSTRATE

FIELD OF THE INVENTION

This invention relates generally to the fabrication of a thin film onto a substrate, and more particularly relates to the deposition of a thin film by laser beam evaporation techniques.

BACKGROUND OF THE INVENTION

Various techniques for depositing thin films of one material on another substrate are known. Of particular attention is a technique known as pulsed laser deposition (PLD). See, e.g., Kim et al., U.S. Pat. No. 4,970,196; Wagal et al., U.S. Pat. No. 4,987,007. In PLD, a pulsed laser beam is directed at a target composed of the material to be deposited as a thin layer. Illumination of a point on the target material by the laser causes the surface of the target substrate to evaporate. The laser pulses are of short duration and high energy, so the surface boils and vaporizes before the underlying layers are heated. The emitted evaporant migrates from the target material to the surface of a deposition substrate, where it is deposited in a thin layer.

While this technique shows promise, it has not been widely used commercially, predominantly because illumination of a point or small area on the target results in uneven distribution on the deposition substrate. Upon illumination, the evaporant of the target material tends to rise from the target surface along a path substantially perpendicular to the surface of the target material, although there is some lateral spreading of the target material as it migrates. Thus the migrating evaporant takes the shape of a narrow cone (termed a "deposition plume") which is dense with evaporant toward its center (i.e., along the longitudinal axis of the cone). The density of the evaporant diminishes rapidly as a function of radial distance from the longitudinal axis of the cone and the distance from the target material. As a result, the area of the deposition substrate immediately adjacent the intersection of the deposition substrate and longitudinal axis of the plume receives considerably more target material than do areas of the deposition substrate somewhat removed from the longitudinal axis; consequently, the deposition layer formed is much thicker in its central portion than its peripheral portions. This shortcoming has restricted the commercial use of PLD to film coverage of deposition substrates with very small surface areas.

In view of the foregoing, it is an object of this invention to provide a PLD method which substantially increases the area over which a substantially constant film thickness can be deposited using PLD.

It is an additional object of this invention to provide an apparatus with which the aforementioned method can be practiced.

SUMMARY OF THE INVENTION

These and other objects are satisfied by the present invention, which as a first aspect includes a method for depositing a film of material on a deposition substrate. The method comprises the steps of (a) illuminating a target material with at least one elliptical laser beam so that a deposition plume is emitted from the target material; and (b) positioning a deposition surface relative to the target material so that the deposition surface receives target material emitted from the deposition plume. In a preferred embodiment, the target material is illuminated with a plurality of concentric elliptical beams.

A second aspect of the present invention is an apparatus for depositing a target material on a deposition substrate. The apparatus comprises: (a) means for producing a laser beam; (b) a beam-separating lens comprising a first substantially flat surface and a second concave surface opposite said first surface comprising a conic section having a cone angle relative to said first surface; and (c) means for focusing a laser beam on a target material. The beam-separating lens is positioned between the laser beam-providing means and the focusing means. In a preferred embodiment, the beam separating lens comprises a plurality of concentric rings circumscribing the conic section of the lens, each of which has an inner diameter, and each of which is angled relative to the first surface of the lens at a steeper pitch than the cone angle of the conic section and the pitch of any concentric ring within its inner diameter.

A third aspect of the invention is a multifaceted axicon that may be used to practice the method described above. The axicon comprises a first substantially flat surface and a second concave surface opposite the first surface. The concave surface comprises a central conic section and at least one concentric ring circumscribing the conic section. The conic section has a cone angle relative to the first surface, and each concentric ring is angled relative to the first surface. Each concentric ring has a steeper pitch relative to the first surface than the cone angle of the conic section and any rings within its inner diameter.

BRIEF DESCRIPTION OF THE DRAWINGS

FIG. 4 shows a schematic side-elevation view of an embodiment of the invention which employs a multifaceted negative axicon to separate the beam.

FIG. 5 shows a cross-sectional schematic view of the formation of three deposition plumes resulting from illumination with three elliptical laser beams.

DETAILED DESCRIPTION OF THE INVENTION

Figures 1A, 1B:
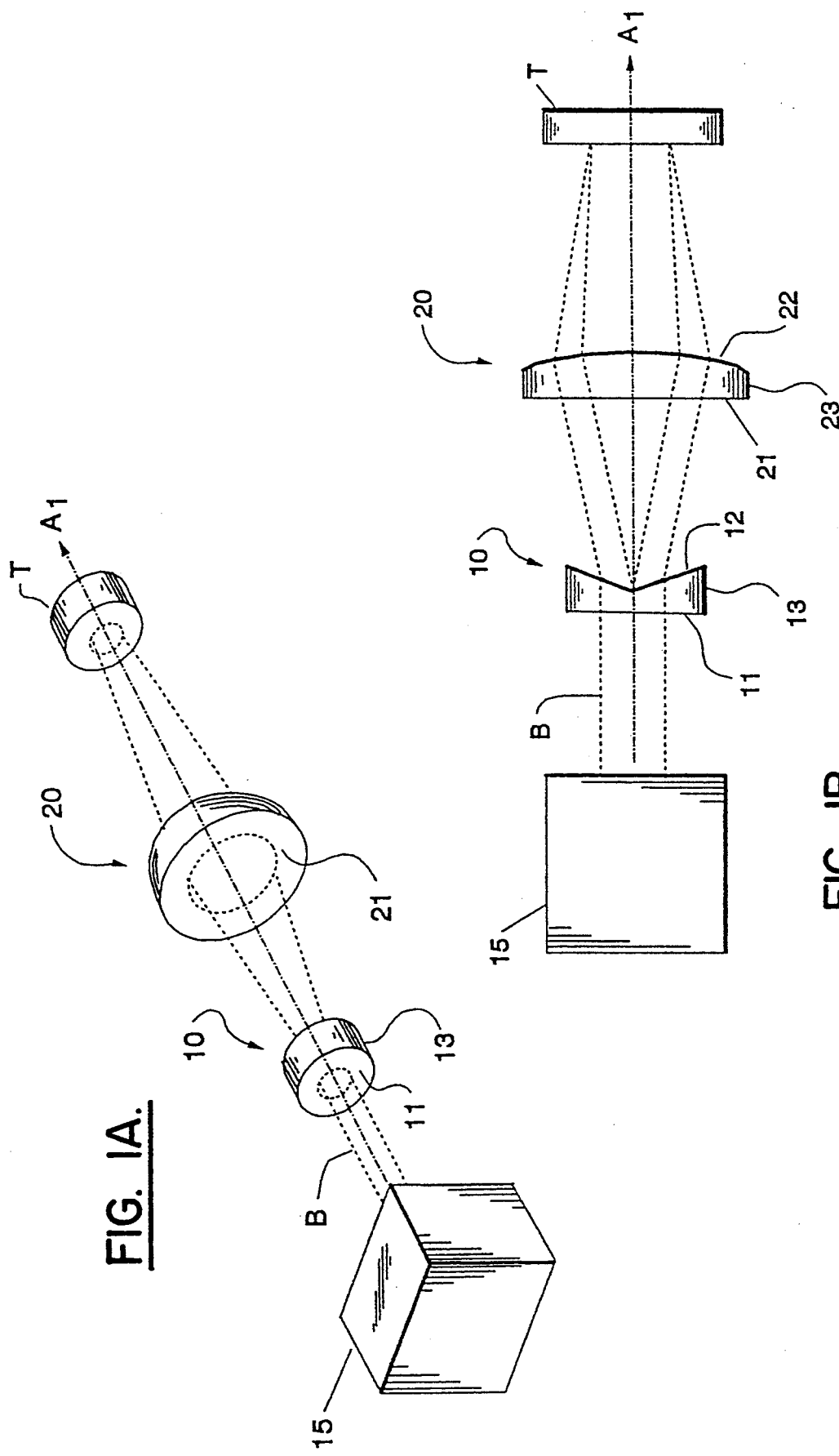
FIG. 1A shows a perspective view of a solid laser beam being separated by an axicon.
FIG. 1B shows a schematic side elevation view of a solid laser beam being separated by an axicon.

The present invention will now be described in greater detail hereinafter. The invention may be embodied in many forms and should not be construed as limited to the embodiments set forth within; instead, these embodiments are provided so that this disclosure will be thorough and complete, and will fully convey the scope of the invention to those skilled in this art.

The following definitions of terms to be used herein will facilitate a more complete understanding of the invention. The terms "ellipse" and "elliptical" are intended to refer to a closed curvilinear shape in which the sum of the distances between any point on the curve defining the shape and two fixed points known as "foci" is a constant. It is intended that this definition include a circle, which is an ellipse in which the two foci coincide at the same point in the center of the circle. Many of the elements of apparatus of the invention are positioned in the path of a laser beam emanating from a laser source and traveling to a target material. The term "downstream" is intended to mean that a given structure is positioned nearer the target substrate than to a particular reference structure. The term "upstream" is intended to mean the a given structure is positioned nearer the laser beam source than a particular reference structure. The term "laser axis" refers to the longitudinal axis of the laser beam upon its emission from the laser source prior to any alteration of the beam by lenses positioned downstream of that source. The term "negative lens" refers to a lens that causes divergence of a beam; conversely, a "positive lens" causes convergence of a beam. A "cylindrical lens" is a lens having one curved surface substantially defined by a portion of a cylinder; a cylindrical lens focuses a beam in only one plane that is parallel to the laser axis. A "spheroidal-cylindrical lens" is a lens that, like a spheroidal lens, focuses a beam in two planes which are normal to each other and parallel to the laser axis, but unlike a spheroidal lens, a spheroidal-cylindrical lens focuses the beam to a greater extent in one of these planes than in the other.

The invention includes as a first aspect a method of depositing a layer of a target material on a deposition substrate. The method comprises the steps of illuminating the target material with at least one elliptical laser beam so that a deposition plume is emitted from the target material, and positioning a deposition substrate relative to the target material so that the deposition substrate receives target material emitted from the deposition plume. Illumination of the target material with an elliptical beam causes the deposition plume to rise from an elliptical origin rather than the point origin observed for targets illuminated by a conventionally focused laser. In the same manner that material spreads laterally from the longitudinal axis of the cone formed from a conventionally focused laser, in the present invention material rising from the target material experiences some lateral spreading; the resulting deposition plume is elliptical with a radial section in the form of a narrow inverted triangle (see FIG. 2). A plume so formed can cover a considerably larger area on the deposition substrate with greater layer thickness uniformity than that covered by a small-area laser source produced by laser pulses.

The method is illustrated by the schematic diagram of FIGS. 1A and 1B. A laser beam source 15 positioned farthest upstream emits a laser beam B along and centered about the laser axis $A_1$. The laser source can be any device producing a coherent beam of substantially collimated visible or invisible light. It is intended that this term include systems incorporating optical elements for deflecting or increasing the diameter of the laser beam. The optical elements often constitute a subsystem known in the art as a "beam expander." Negative axicon 10 is shown having a substantially flat surface 11, a conic surface 12, and a cylindrical peripheral surface 13. The flat surface 11 comprises the upstream surface of the axicon 10 and is disposed essentially perpendicularly to the laser axis $A_1$. The conic section 12 comprises the downstream surface of the axicon 10 and has its longitudinal axis coincident with the laser axis $A_1$. As axicon 10 is a negative axicon, apex of the conic section 12 points upstream. Preferably the cone angle of the conic section 12 is shallow relative to the flat surface 11 to reduce power losses in the beam as it passes through the axicon.

Downstream of the negative axicon 10 is a positive focusing lens 20. The focusing lens 20 comprises a substantially flat surface 21, a convex surface 22, and a cylindrical peripheral surface 23. The flat surface 21 faces upstream and is substantially perpendicular to the laser axis $A_1$. The convex surface 22 faces downstream and is axially symmetric about the laser axis $A_1$. Those skilled in this art will appreciate that the focusing lens 20 need not have a flat upstream surface as shown, but instead could include a convex or concave upstream surface, and still be suitable for use with this invention. Further, the convex surface need not take the curvature shown but can take any curvature that, in conjunction with the upstream surface, focuses a beam onto the surface of a target material T.

As shown in FIG. 1, laser beam B is generated by the source 15 and is directed at the axicon 10 along laser axis $A_1$. At this point the beam B has a solid cross-section. As it reaches and passes through the axicon 10, the beam B is redirected and separated so that it forms a beam having a hollow circular cross-section (shown in longitudinal cross-section as a split beam in FIG. 1). In this form the beam passes to and through the positive lens 20, which focuses the beam onto the surface of the target material. Thus the target material is illuminated by a circular beam, with the result that the deposition plume rises from a circular origin as shown in FIG. 2.

Figure 2:
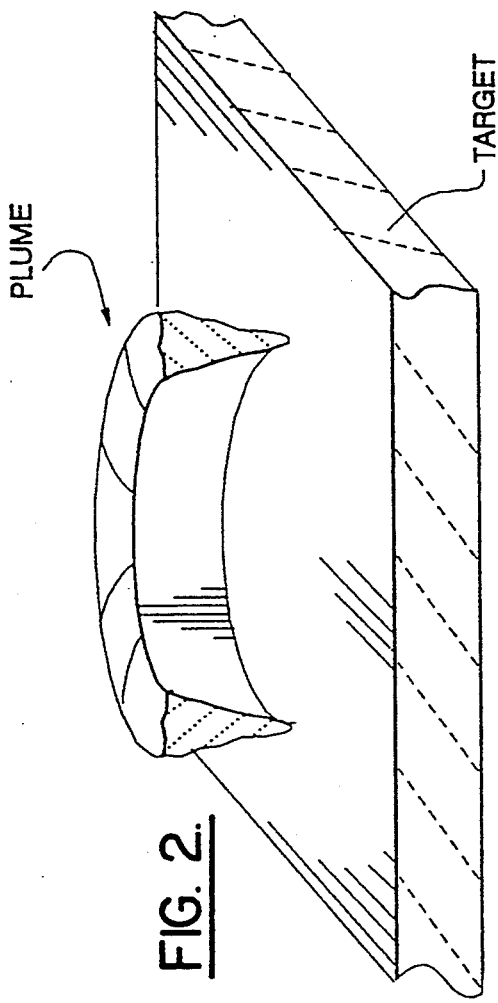
FIG. 2 shows a cutaway schematic view of the general shape and evaporant density distribution of an evaporation plume resulting from illumination with an elliptical laser beam.

The principle underlying the embodiment of FIG. 2, i.e., that expanding the size of the illumination origin results in wider and more uniform coverage of the deposition surface, is expanded in a preferred embodiment illustrated in FIG. 4. In this embodiment, the target material is illuminated with three concentric elliptical beams. To create the three beams, this embodiment employs a multi-faceted negative axicon, designated broadly in FIG. 3 at 50. The axicon 50 comprises a substantially flat surface 51 and an axiconal surface 52 opposite the flat surface 51. The axiconal surface 52 comprises an inner conic section 53, a first concentric ring 54, and a second concentric ring 55. The conic section has a cone angle $\alpha_1$ relative to the flat surface 51. The inner diameter of the first concentric ring 54 circumscribes the outer diameter of the conic section 52 and is sloped from inner diameter to outer diameter relative to the flat surface 51 at a ring angle $\alpha_2$ that is steeper in pitch than the cone angle $\alpha_1$. The inner diameter of the second concentric ring 55 circumscribes the outer diameter of the first concentric ring 54 and is sloped relative to the flat surface 51 at a ring angle $\alpha_3$ that is steeper in pitch than either $\alpha_1$ or $\alpha_2$.

The advantageous use of the negative axicon 50 is illustrated in FIG. 4, which is identical to the embodiment of FIG. 1 with the exception that the negative axicon 10 of FIG. 1 has been replaced with the multi-faceted negative axicon 50 (it should be noted that the angles between the laser axis and the axicon surfaces are exaggerated for purposes of visual clarity). The flat surface 51 is oriented to face upstream and reside normal to a laser axis $A_2$. As a beam passes through the axicon 50 and exits the axiconal surface 52, the beam is separated into three concentric diverging circular beams: one circular beam $B_1$ exits from the conic section 53; one circular beam $B_2$ exits from the first concentric ring 54 and is of a greater diameter than beam $B_1$; and the other beam $B_3$ exits from the second concentric ring 55 and is of a greater diameter than either beam $B_1$ or beam $B_2$. Each of these circular beams is focused by a focusing lens 56 to illuminate a target material with three concentric circular beams. Illumination of the target material by these three beams causes the emission of three concentric deposition plumes. The evaporants comprising these plumes then migrate to the deposition surface as described above.

There are two advantages inherent in this embodiment. First, the creation of three concentric plumes results in a wider, more uniform deposition layer. Second, the deposition uniformity can be further improved if, as is preferred, the structure and the positioning of the axicon and the focusing lens are such that, as concentric beams resulting therefrom illuminate the target material, the deposition plumes originate from positions that are sufficiently near to one another that the peripheral regions of adjacent deposition plumes overlap. (See FIG. 5 for a schematic representation). As the peripheral regions tend to be less dense with evaporant than the portions of the plume directly above the plume origin, overlapping with the peripheral regions of adjacent plumes can increase the evaporant density of those regions and thus improve the overall uniformity of material distribution on the deposition substrate.

It will be understood by those skilled in this art that this embodiment is not limited to one conic section and two concentric rings, but instead can include any axicon which includes a central conic section and at least one concentric ring angled relative to the flat upstream surface 51 at a greater pitch than the cone angle of the conic section 53. It is preferred that the axiconal surface 52 comprise a plurality of concentric rings, each of which is angled relative to the flat surface 51 at a steeper pitch than all rings within its inner diameter and the conic section 53. The plurality of concentric rings can include three, four, five, or even up to ten or more rings, and still be operable with the invention. As with the simple negative axicon shown in FIG. 1, a shallow cone angle and shallow ring angle pitches are preferred in a multi-faceted axicon to reduce power losses in the beam as it passes therethrough. A multi-faceted axicon such as that shown in FIG. 3 preferably separates a beam so that the linear power density for each of the concentric beams produced is approximately the same. As used herein, "power density" refers to the laser intensity per unit of illuminated area (measured, for example, in Watts/cm$^2$). By way of illustration, if the light energy passed by the innermost circular beam (the beam emanating from the conic section of the axicon) is 0.1 Joule for a 10 nanosecond laser pulse, then the average power during the pulse is 10 Watts. If the diameter of the annular light pattern on the target produced by the focusing lens, and corresponding to the innermost circular beam, is 1 cm, with a width of 0.1 cm, then the average power density on the illuminated target during the laser pulse is $3.18 \times 10^7$ W/cm$^2$. The radii and pitch angles of the concentric rings of the axicon and the focal length of the focusing lens then should be chosen so that each of the other concentric beams produced therefrom has a similar power density. The power densities of the other concentric rings can be calculated by the methods presented in the Examples below. If each of the circular beams do indeed have power densities, the density of evaporant comprising the deposition plumes produced therefrom should also be similar, a condition which should improve uniformity of the deposition layer on the deposition substrate.

Figure 6:
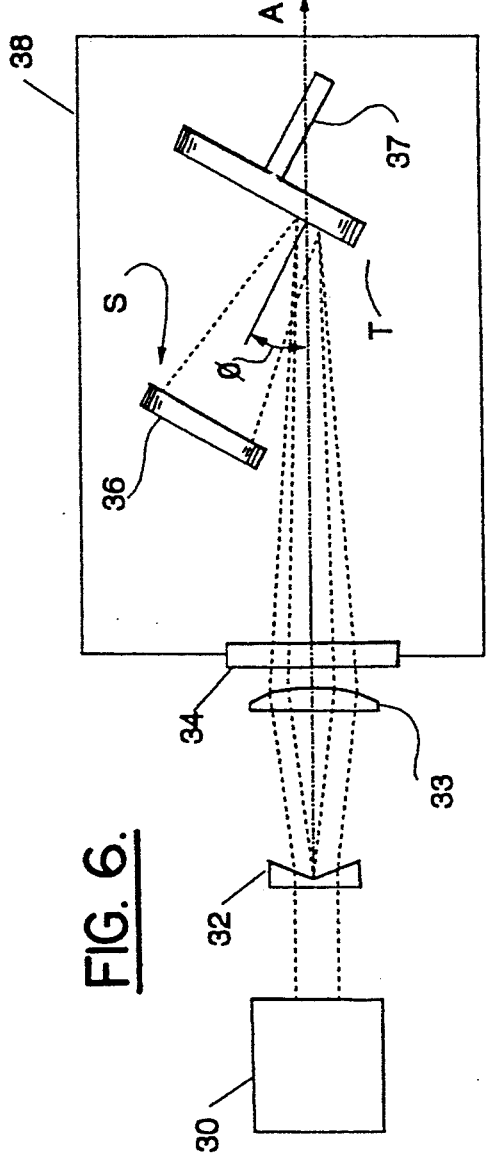
FIG. 6 shows a cross-sectional view of a typical embodiment of the invention.

FIG. 6 shows an exemplary configuration of the present invention. This embodiment comprises a laser source 30, a beam-separating lens 32 (shown herein as a simple negative axicon, although those skilled in this art will appreciate that a multi-faceted negative axicon would also be suitable), a focusing lens 33, a support 35 for securing the target material, a support 36 for securing the deposition substrate, and a vacuum chamber 38.

The laser beam source 30 is positioned farthest upstream to produce a beam along the laser axis $A_3$. The laser source 30 can be any source capable of producing a pulsed laser beam of the intensity necessary to evaporate the target material. The requisite intensity focus of the beam at the target will depend largely on the identity of the target material, but will generally range between about $10^5$ and $10^{10}$ W/cm$^2$, and more preferably will range between about $10^7$ and $10^9$ W/cm$^2$. Typically, the pulse duration for a suitable laser is between 0.5–20 nanoseconds. An exemplary laser source is Q-switched NdYAG model YG81, available from Continuum, Santa Clara, Calif.

The axicon 32 is positioned to be axially symmetric about the laser axis $A_3$. For clarity, a simple negative axicon is illustrated herein, but those skilled in this art will appreciate that a multi-faceted axicon is preferably used because of its ability to generate multiple concentric beams. The focusing lens 33 is then positioned axisymmetrically about the laser axis $A_3$ adjacent and slightly downstream of the axicon 32.

The vacuum chamber 38 surrounds the environment in which deposition of the target material occurs. A vacuum environment is preferred to increase uniformity of layer thickness and to reduce contamination of the deposition layer caused by impurities in the atmosphere, although the procedure can be used successfully in air or in some other gaseous environment. The vacuum chamber 38 includes optical port 34 which provides an inlet for the beam and a viewing window for observation of the procedure.

A target material support 35 downstream of the optical port 34 secures the target material T for illumination. The support 35 should be positioned so that the distance between the focusing lens 33 and the target material T is approximately equal to the focal length of the lens 33. The actual distance between the lens 33 and T will depend on the desired light intensity at T. Typically, there will be an intentional defocusing at T. In this embodiment, the target material T is disposed at an angle $\Phi$ to the laser axis $A_3$.

A rotation unit 37 is connected to the target material support 35. The rotation unit 37 is positioned so that its center of rotation does not coincide with the center of the illumination footprint. In operation, the target material T rotates about the center of rotation of the rotating unit 37. If instead the same target surface is presented for illumination through the procedure, craters can form in the target material T as evaporant rises from the surface. After a short period of illumination, the crater can become sufficiently deep that evaporation and migration of evaporant are adversely affected. The illuminated surface, having receded, receives light of a different intensity, which modifies the evaporation rate of target material. Also, formation of a crater can influence the migration pattern of the deposition plume. This is due to the fact that the incident laser beam is inclined at an angle with respect to the target normal. The deepening crater tends to have inclined walls, which causes material emission to deviate from the normal direction. By rotating the target material during illumination, crater formation in any one location is slowed considerably. Any number of means for rotating the target material, such as a motor-driven disk, which rotate the material at a speed sufficient to inhibit crater formation and which do not interfere with the formation and migration of deposition plumes are suitable for use with the invention.

A deposition substrate support 36 secures the deposition substrate S during deposition of the target material T. It is positioned parallel to the illuminated surface and is centered on the center of the plume origin. The deposition substrate S is typically positioned between 1 and 10 cm from the illuminated surface of the target material T; generally, uniformity of deposition improves as the distance between the target T and the deposition substrate S increases, but the thickness of the deposition layer decreases under the same conditions.

In the configuration of FIG. 6, it can be observed that, because the illuminated surface of the target material T is disposed at the angle $\Phi$ to the laser axis $A_3$, the "footprint" of the beam illuminating the target and creating the deposition plume is not a circle, but rather is a non-circular ellipse. A deposition plume rising from an elliptical origin can be nonuniform due in part to the non-circularity of the annular pattern produced on the target, and in part to the nonuniformity of the power density of the beam, which is a consequence of the varying width of the resulting elliptical annulus pattern.

The beam is essentially uniform in intensity about its circumference as it is separated by the axicon 32 and focused by the focusing lens 33; however, if this beam illuminates the target material with an elliptical footprint, the portions of the beam comprising the longer sides of the ellipse illuminate the surface with a lower linear power density than the portions of the beam comprising the shorter sides of the beam. Consequently, thickness distribution of material deposited on the deposition surface will differ depending on which portion of the elliptical footprint a particular region of the deposition surface confronts. For example, material deposited on the substrate along the line parallel to the ellipse major axis will be spread out the most. For these reasons a circular illumination footprint of uniform circumferential intensity is preferred.

Figure 8:
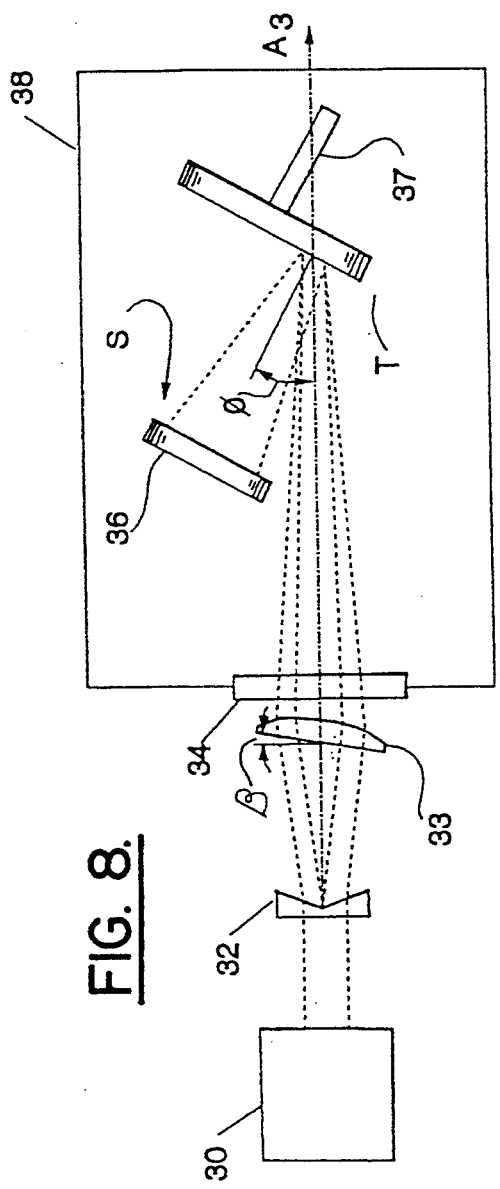
FIG. 8 is a cross-sectional view of an embodiment of the invention in which the focusing lens is tilted relative to the laser axis to reduce ellipsicity of the laser footprint on the target.

Several embodiments encompassed by this invention are addressed to ameliorating or correcting the problem of nonuniform target material distribution caused by a non-circular light pattern on the target. One of these, shown in FIG. 8, consists of tilting the focusing lens 33 at an angle B around an axis perpendicular to the page. For a suitable tilt angle B of the focusing lens, the elliptical pattern on the target surface can be made nearly circular. In a configuration that accomplishes this, the object plane (for this purpose supposed to be the plane of the axicon) and image plane are both effectively inclined with respect to the focusing lens axis in such a way that these planes and the plane of the lens all meet in a single line (known in the art as the Scheimpflug condition).

Figure 7:
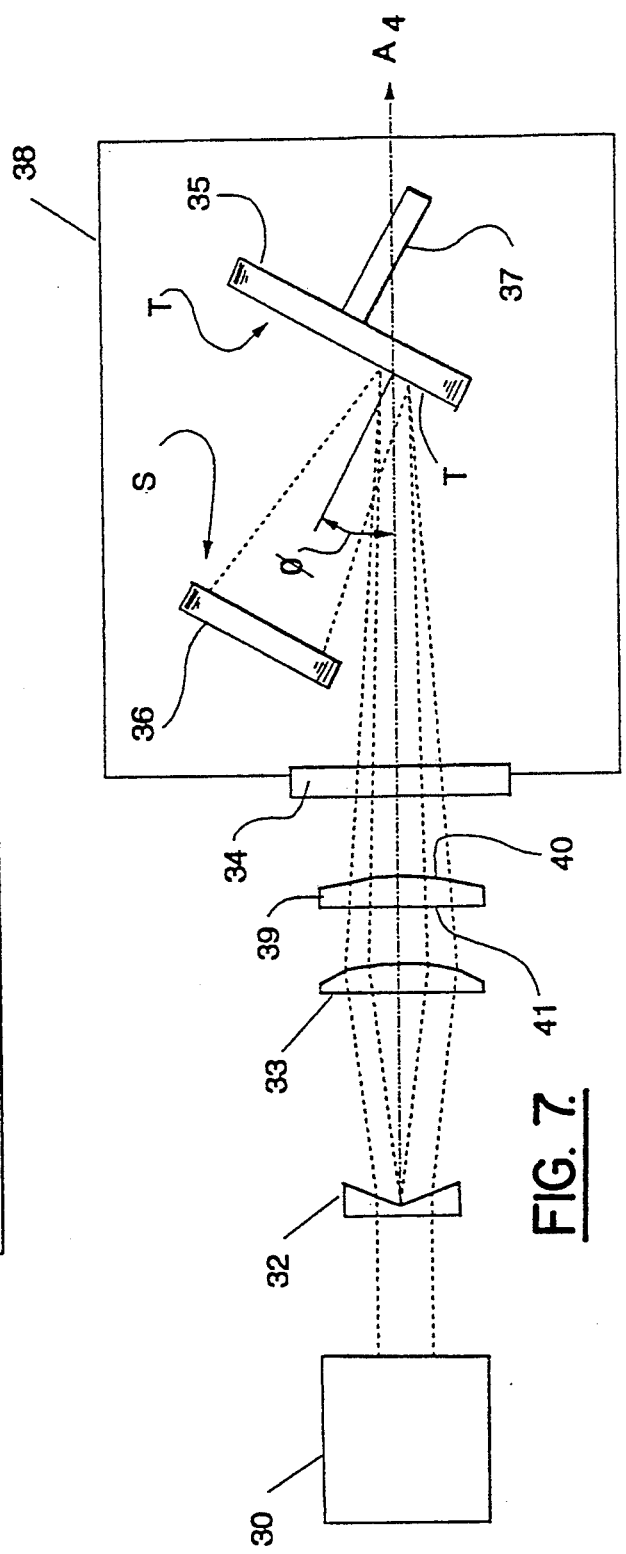
FIG. 7 shows a cross-sectional view of an embodiment of the invention which includes a cylindrical lens to reduce or eliminate the ellipsicity of the illumination beam on the target material.

A second embodiment of this invention addressing the problem of nonuniform target material distribution is shown in FIG. 7. This embodiment is identical to that shown in FIG. 6 with the addition of a cylindrical lens 39. As with the embodiment of FIG. 6, a simple negative axicon 32 is shown by clarity of illustration, but a multi-faceted negative axicon is preferred. The cylindrical lens 39 has an upstream flat surface 41 and a downstream arcuate surface 40; the arcuate surface 40 is not axially symmetric, but instead has two perpendicular planes of symmetry parallel to the laser axis $A_4$ but normal to one another. As described above, the beam is separated into a circular beam by the axicon 32, then is focused by the positive lens 33. As the converging beam passes through the cylindrical lens 39, the cylindrical shape of the lens 39 focuses the beam in a first plane parallel to the laser axis $A_4$ (the plane parallel with the page surface in FIG. 7), but does not focus the beam in a second plane normal to the first plane and parallel to the laser axis $A_4$ (the plane perpendicular to the page surface in FIG. 7). This single plane focusing causes the beam exiting the arcuate surface 40 to take an elliptical cross-section. The cylindrical lens 39 should be oriented relative to the target material so that the elliptical beam produced therefrom is oriented with its major axis normal to the page in FIG. 7 and its minor axis parallel to the page but perpendicular to the laser axis $A_4$. An elliptical beam so oriented can counteract the elliptical lengthening of the beam that occurs due to the orientation of the laser axis $A_4$ at the angle $\Phi$ to the target material T. It will be appreciated by those skilled in this art that the focusing lens 33 and the cylindrical lens 39 can be combined into a single spheroidal-cylindrical lens (not shown) that focuses in perpendicular planes parallel to the laser axis $A_4$, but focuses in one of those plane to a greater extent than in the other.

Figure 9:
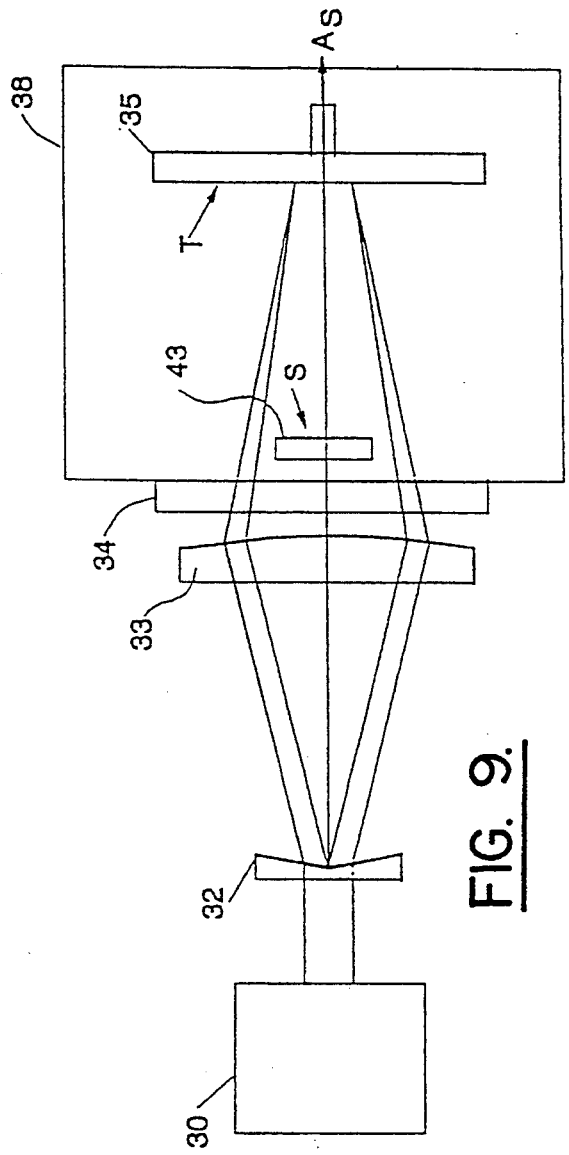
FIG. 9 shows a cross-sectional view of an embodiment of the invention in which the deposition substrate is positioned between the focusing lens and the target material.

In each of the previously described embodiments, circularity of the pattern at the target is obtained, but the average power density is not necessarily uniform along the annulus. It should be noted that in both cases uniformity increases for a smaller tilt angle $\beta$ of the target normal with respect to the laser axis. An embodiment that can produce circular footprints on the target surface with uniform power densities along the rings is illustrated FIG. 9. In this configuration the relative positioning of the laser source 30 the axicon 32, and the positive lens 33 is the same as for the embodiments described above. The target material support 35 is still positioned to secure the target material T downstream from the positive lens at a distance approximately equal to the focal length of the lens 33. However, in this embodiment the illuminated surface of the target material T is oriented to directly face the incoming laser; i.e., this surface is normal to the laser axis $A_5$. The substrate support 43 is positioned so that the deposition substrate S is located between the focusing lens 33 and the target material T so that the deposition substrate S resides in the volume within the circular beam. In this embodiment the beam exits the focusing lens 33 as a circular beam; because the surface of the target material T is normal to the laser axis $A_2$, the illuminating footprint on the target surface is also circular. Further, as can be seen from the symmetry of the arrangement, the power density will be uniform along the beam footprint at the target. The focusing lens 33, the substrate support 43, and the deposition substrate S must each be sized and positioned along the laser axis $A_5$ so that the substrate support 43 and the substrate S itself do not interfere with the transmission of the beam between the focusing lens 33 and the target material T.

It will be appreciated by those skilled in this art that this invention can be used to illuminate virtually any solid or liquid. Exemplary target materials of interest include ceramics, such as $YBa_2Cu_3O_7$, $BaTiO_3$, $Pb(Zr,Ti)O_3$, $LiNbO_3$, etc.; oxides, such as SiO, $SiO_2$, $SnO_2$, $Ta_2O_5$, etc.; semiconductors, such as Si, Ge, diamond-like carbon, SiC, GaAs, GaAlAs, InP, InPSi, ZnSeGaAs, etc., metals, and glasses. The range of suitable target materials is not limited to these, particularly if reactive deposition is included, i.e.: when a reactive gas is admitted to the chamber during deposition. Liquid targets are also suitable, particularly those with single element composition.

Suitable deposition substrates include virtually any material capable of binding to an evaporated target substrate. Of particular interest are materials, such as polymers, which are not able to withstand the temperatures required to melt the target substrate; the present invention does not subject the deposition substrate to heat, and so it may be more attractive when such a material is to be used. Other exemplary deposition substrates include metals, ceramics, glasses, complex oxides, and glasses, oxides, semiconductors, and any other solid materials which can be polished or produced with sufficiently smooth surfaces. Also, substrates coated with films of any solid material can be used as a deposition substrate.

The invention can be more completely understood by those skilled in this art by the following nonlimiting examples.

EXAMPLE 1

Calculation of Film Deposition Thickness and Area

The evaporant emission distribution from a small source for PLD can be modeled as a $\cos^n$ function. The actual value of n must be determined experimentally for particular beam fluence and target material conditions but for purposes of this example is arbitrarily selected as n=7. The treatment is the same for other values of n, and can be easily adapted to other symmetric distributions.

Figure 10:
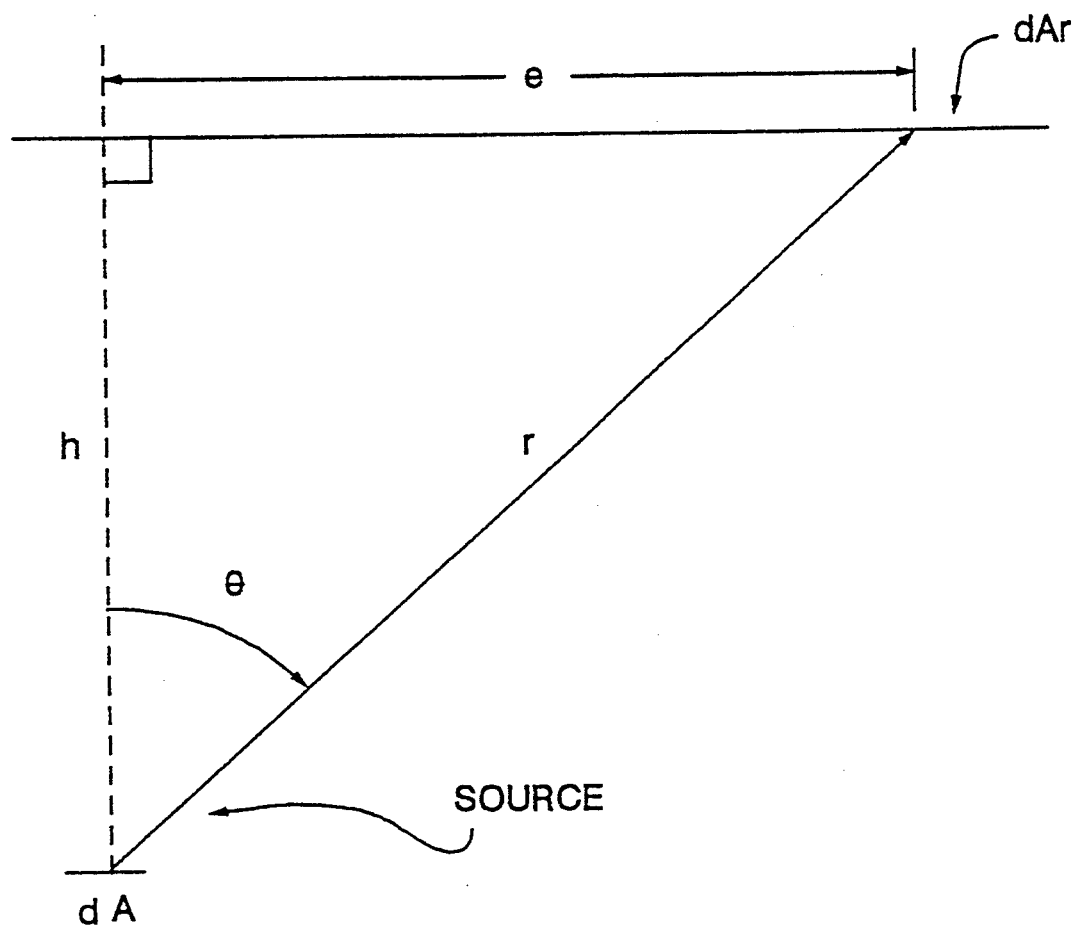
FIG. 10 is an illustration of the parameters used to derive the mathematic expression for deposition of target material emanating from a small area source.
Figure 11:
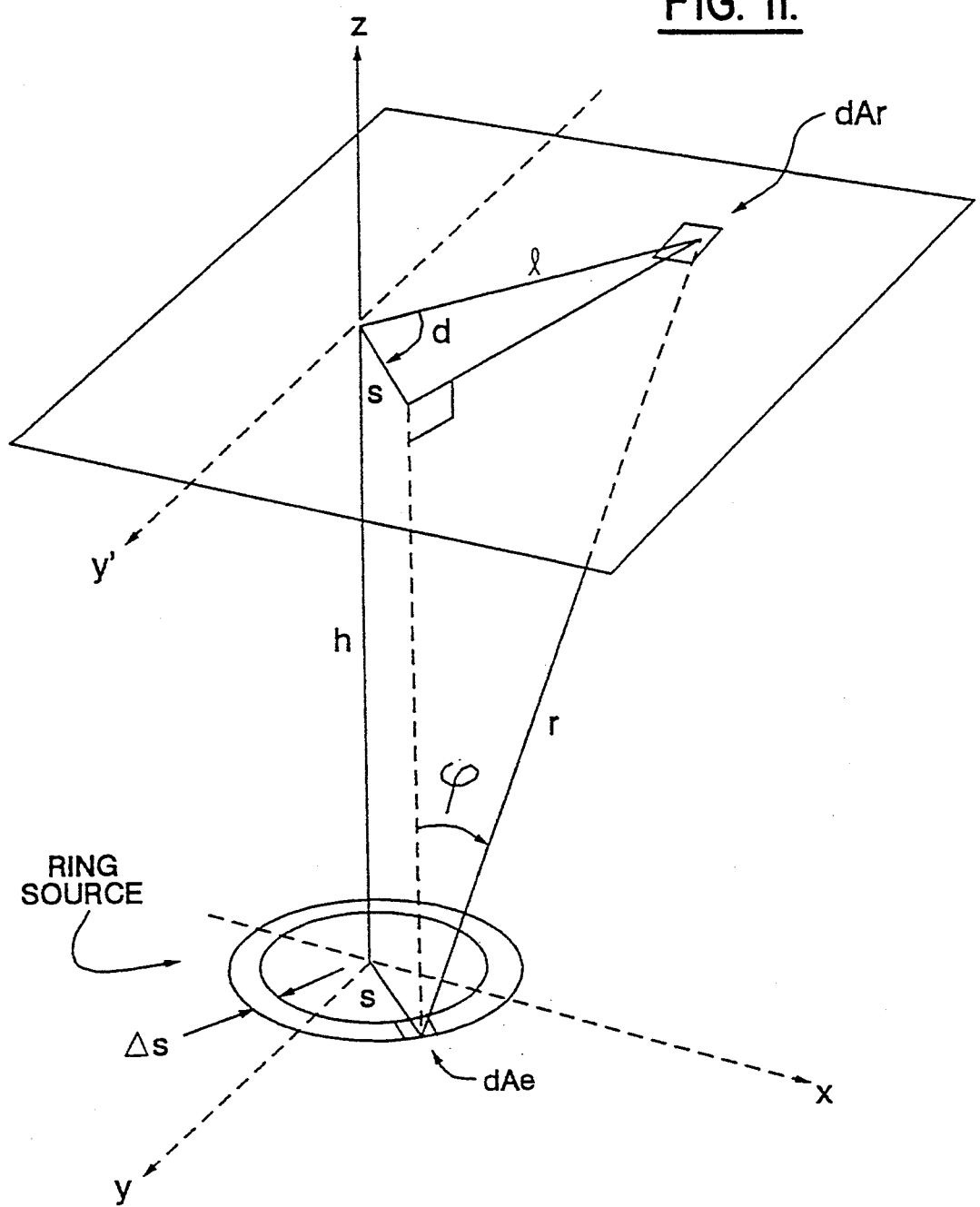
FIG. 11 is an illustration of the parameters used to derive the mathematic expression for deposition of target material emanating from a concentric ring source.

The notation used herein is that of Glang, in *Handbook of Thin Film Technology*, 1-55, (L. Maissel et al., eds., McGraw-Hill (1970)), wherein results are presented for film thickness distributions resulting from sources with a cosine emission distribution (i.e., $\cos^n$ with n=1), for the cases of both small-area and single ring sources. The surfaces of target and substrate are assumed to be parallel to each other and separated by a distance h. The radial distance along the substrate is measured from the point directly opposite the geometric center of the illumination footprint of the target and is equal to l. The radius of the $i^{th}$ annular source is $s_i$. The film thickness is designated as d. These parameters are shown in FIGS. 10 and 11.

Figure 12:
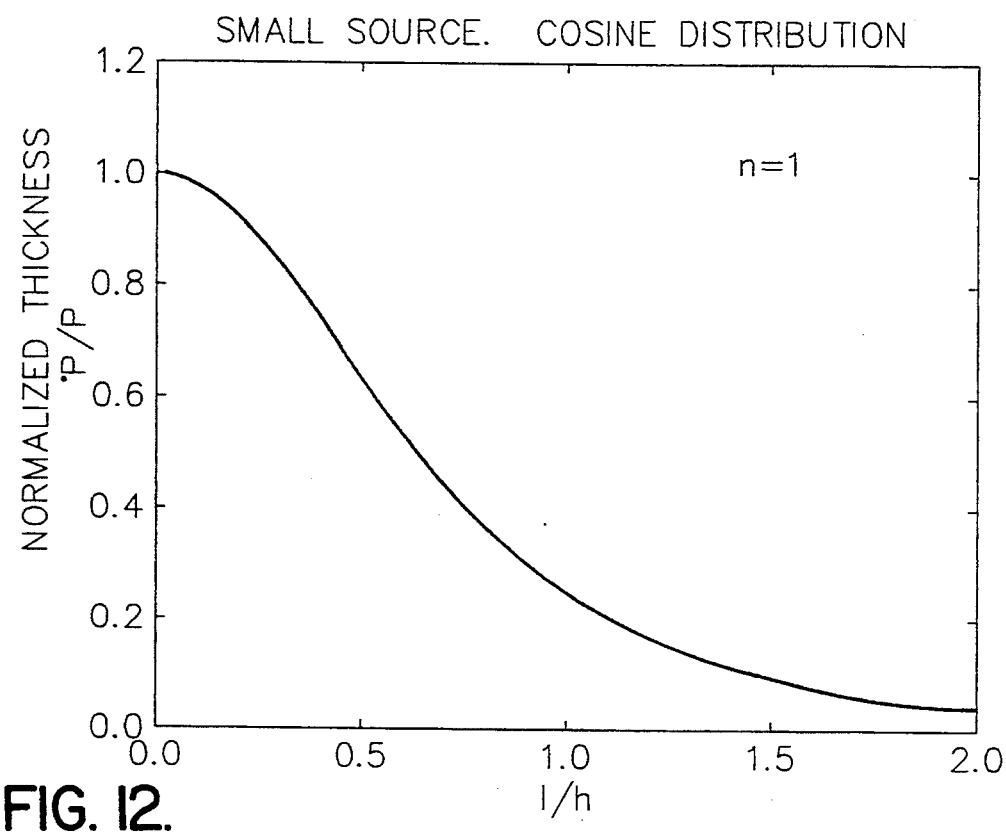
FIG. 12 is a graph of thickness distribution as a function of distance from the deposition center for a small area source when n=1.
Figure 13:
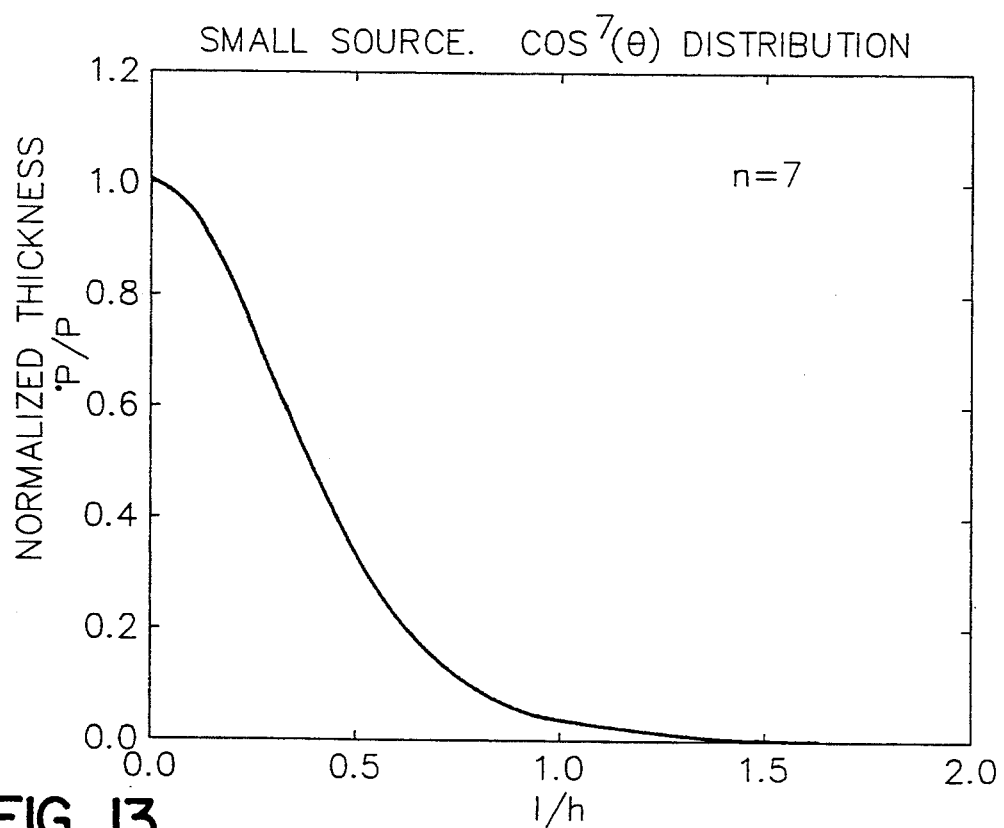
FIG. 13 is a graph of thickness distribution as a function of distance from the deposition center for a small area source when n=7.

Results are presented in terms of $d/d_0$, the normalized film thickness, as a function of l ($d_0$ being the thickness at substrate center where l=0). FIGS. 12 and 13 illustrate the deposited thickness distribution for small-area sources with (a) $\cos^1$ and (b) $\cos^7$ distributions of evaporants. From a straightforward modification of the treatment in Glang.

$$\frac{d}{d_o} = \frac{l}{\left[l + \left(\frac{l}{h}\right)^2\right]^{\frac{n+3}{2}}} \quad (1)$$

The graphs for n=1 and n=7 are a function of the dimensionless parameter l/h. FIGS. 11 and 12 demonstrate that the thickness uniformity is much worse for the n=7 case.

For the case of N thin concentric ring sources, $S_1$, $S_2$, $\ldots$ $S_N$ (FIG. 11) emanating from the target with $\cos^n$ emission distribution, the normalized thickness $d/d_o$ is:

$$\frac{d}{d_o} = \frac{1}{2\pi} \frac{\sum_{i=1}^{N} s_i \int_0^{2\pi} d\alpha \left[1 + (l/h)^2 + (s_i/h)^2 - \frac{2ls_i}{h^2}\cos\alpha\right]^{-(n+3)/2}}{\sum_{i=1}^{N} \frac{s_i}{[1 + (s_i/h)^2]^{+(n+3)/2}}} \quad (2)$$

This equation reflects that each ring source has a width which is much less than its radius. For simplicity, the width of all rings is assumed to be equivalent.

Figure 14:
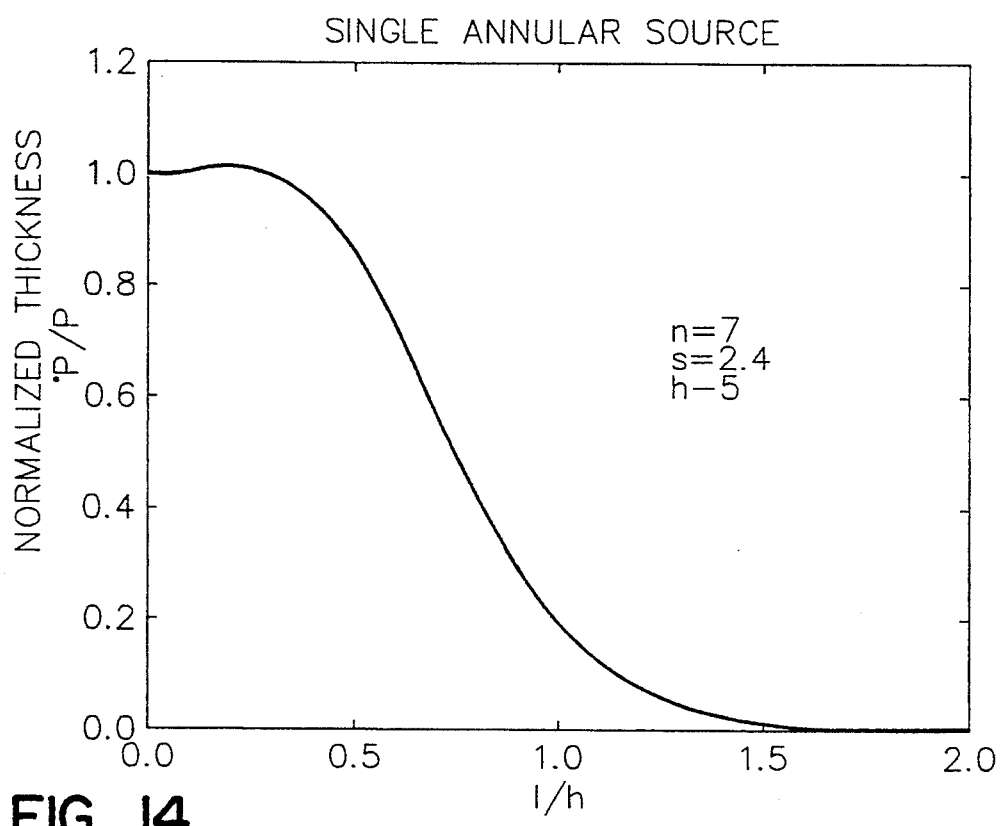
FIG. 14 is a graph of thickness distribution as a function of distance from the deposition center for a single annular laser source when n=7.
Figure 15:
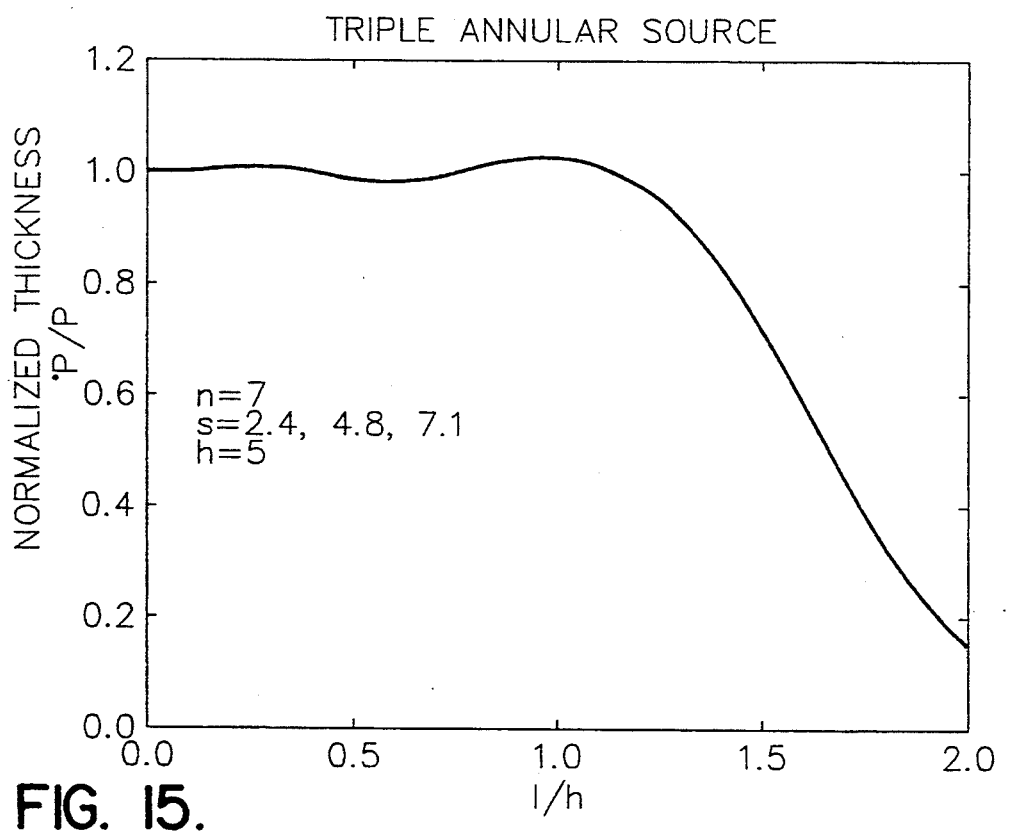
FIG. 15 is a graph of thickness distribution as a function of distance from the deposition center for a triple annular laser source when n=7.

Suitable values for $s_i$ are determined by evaluating this expression numerically for a given n while varying $s_i$ until a sufficiently flat substrate region is generated from l/h=0 to a desired deposition radius. FIGS. 14 and 15 illustrate the numerical results obtained for n=7 assuming: (a) a single-ring source; and (b) a three-ring source. These figures show a considerable improvement in thickness uniformity results from the single-ring and three-ring source compared with the small-area source result for n=7 in FIG. 13. It is to be understood that the values of $s_i$ effecting these results may be modified to obtain a specified tolerance in the thickness uniformity up to a specified substrate radius l.

EXAMPLE 2

Calculation of Axicon Parameters

The optimum radii $s_i$ of the annular emission zones at the target can be predetermined as in Example 1. Providing these optimum radii $s_i$, of the annular emission zones at the target depends on (1) the particular functional dependence of the emission distribution for the existing conditions at the target, and (2) the number of annular zones to be produced at the target. The results can be modified to account for the case of arbitrary emission zone width and for beams with other radial distributions of intensity $I(r)$.

For a Gaussian $TEM_{00}$ laserbeam, in a given plane perpendicular to the symmetry axis of the beam, the intensity (I) as a function of the radial distance (r) from the beam axis is:

$$I(r) = I_o e^{-2(\frac{r}{2})^2} \quad (3)$$

where $I_0$ is the intensity at the beam axis and w is a beam width parameter. The quantity 2 w is known as the "spot size." The total power, $P_{Total}$, transmitted by the beam is the integral from r=0 to ∞ of the expression for I(r), and is equal to:

$$P_{total} = \left(\frac{\pi}{2}\right) I_o w^2 \quad (4)$$

The power $(P_n)$ transmitted through the $n^{th}$ annular region of a multi-faceted axicon, bounded by circles of radii $r_{n-1}$ and $r_n$, is equal to the integral of the expression I(r) with appropriate limits. This yields:

$$P_n = P_{total}\left[e^{-2\left(\frac{r_{n-1}}{w}\right)^2} - e^{-2\left(\frac{r_n}{w}\right)^2}\right] \quad (5)$$

The power density (power per unit area) at each illuminated region of the target should be the same. The areas of these regions are equal to:

$$A_n = 2\pi s_n \Delta s \quad (6)$$

assuming equal widths ($\Delta s$) for each illuminating ring. For N zones, $P_n/A_n$ is constant for every n, $$P_n = P_1\left(\frac{S_n}{S_1}\right) \quad (8)$$

Further, $$P_{total} = \sum_{i=1}^{N} P_i$$

Combining the expressions for $P_n$ and $P_{total}$ gives, $$P_n = P_{total}\frac{S_n}{\sum_i s_i} \quad (9)$$

The recursive relation for the radii $(r_i)$ defining the concentric regions of the multi-faceted axicon is given the combination of the expressions above for $P_n$ with Equation (5).

$$\frac{r_i}{w} = \sqrt{-1/2\ln\left[e^{-2(r_i-1/w)^2} - \frac{S_i}{\sum_n S_n}\right]} \quad (10)$$

The initial radius, $r_0$, is equal to 0, since it corresponds to the beam axis. Due to the implication in Equation (3) that the beam extends radially to an infinite radius, the last result in the recursion Equation 10 is also an infinite radius. Practically, the beam intensity is already quite reduced at r=w, and thus it is only necessary that the final axicon radius (and hence the lens radius) be somewhat larger than w.

Figure 3:
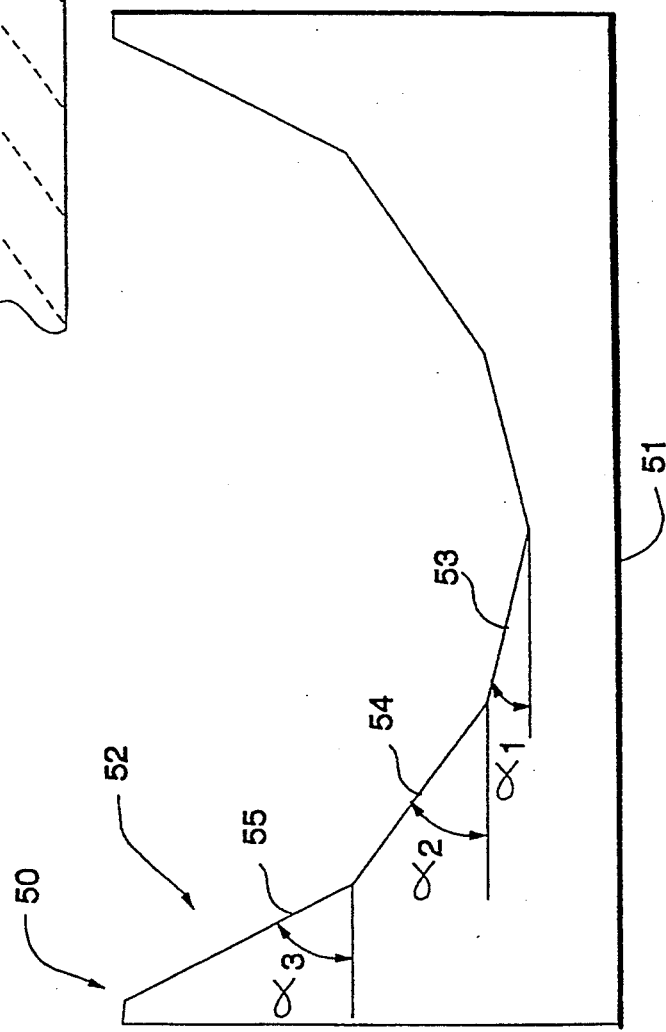
FIG. 3 shows a cross-sectional view of a multifaceted negative axicon.

For the three ring axicon illustrated in FIG. 3, assuming values indicated in FIG. 15, Equation (10) yields the axicon radii values: $r_0=0$, $r_1/w=0.28$, $r_2/w=0.58$, and $r_3=$infinite. The actual radii for the axicon conic zones depend on the actual value of w for the laser used. Assuming a spot size 2w=10 mm, the axicon radii values are: $r_1=1.4$ mm, and $r_2=2.9$ mm. Therefore, a suitable multi-faceted axicon will have an innermost facet with a diameter of 2.8 mm, an intermediate facet extending from this point up to a diameter of 5.8 mm, and an outermost facet extending from the boundary of the intermediate facet to the outside effective diameter of the lens, which is greater than 10 mm.

Because of the simplicity of this derivation, this result neglects losses caused by reflections at the various lens surfaces traversed by the split beam. In practice these losses can be rendered negligible by using appropriate anti-reflection coatings on each of the surfaces.

EXAMPLE 3

Calculation of Axicon Angles

The angles of the axicon depend on the particular configuration implementation from the axicon to the target. After the multiple beam passes the focusing lens, it comes to near-focus at the target in circles defined by the $s_i$ radii. The ray trajectories for different axicon angles can be calculated in a straightforward manner by standard methods of geometrical Optics.

Assuming that only the focusing lens is inserted between the axicon and target, and that the amount of defocus is small compared to the focal length of the focusing lens, the angle $\alpha_n$ corresponding to conic surface n is approximately:

$$\alpha_n = \frac{\frac{s_n}{f}}{n_A - 1} \quad (11)$$

where $\alpha_n$ is in radians, $s_n$ is the radius of the corresponding circular source at the target, f is the focal length of the focusing lens, and $n_A$ is the refractive index of the glass material of which the axicon is made.

Given the values of $s_n$, the values for any given focusing lens can be calculated. Assuming f=100 mm, $\alpha_1$=0.040 radians (2.3 degrees), $\alpha_2$=0.096 radians (5.5 degrees), and $\alpha_3$=0.142 radians (8.1 degrees).

The foregoing examples are illustrative of the present invention, and are not to be construed as limiting thereof. The invention is defined by the following claims, with equivalents of the claims to be included therein.

That which is claimed is:

1. A method of depositing a layer of a target material on a deposition substrate which comprises the steps of:
   (a) illuminating the target material with at least one ring-shaped elliptical laser beam so that a ring-shaped elliptical illumination pattern is formed on the target material and so that a deposition plume is emitted from the pattern so formed on the target material; and
   (b) positioning a deposition substrate relative to the target material so that the deposition substrate receives target material emitted from the deposition plume.

2. A method according to claim 1, which further comprises the step of passing a laser beam through a first lens, the lens comprising a first substantially flat surface and a second surface opposite the first surface comprising a concave conic section having a cone angle relative to the first surface, to form the at least one elliptical laser beam prior to said illuminating step.

3. A method according to claim 2, wherein the first lens further comprises at least one concentric ring, said at least one concentric ring being angled relative to said first surface, and said at least one concentric ring having a steeper pitch relative to said first surface than the cone angle of said conic section.

4. A method according to claim 2, wherein said at least one concentric ring comprises a plurality of concentric rings, each of said plurality of concentric rings having an inner diameter and being angled relative to said first surface, and each of said plurality of concentric rings having a steeper pitch relative to said first surface than the cone angle of the conic section and the pitch of any rings within its inner diameter.

5. A method according to claim 1, wherein in said illuminating step, the elliptical laser beam is one circular laser beam.

6. A method according to claim 1, wherein said illuminating step further comprises the step of altering the ellipsicity of the at least one elliptical laser beam prior to the illuminating step.

7. A method according to claim 1, which further comprises rotating the target material during said illuminating step.

8. A method according to claim 2, which further comprises focusing the at least one elliptical laser beam on the target material prior to the illuminating step.

9. A method according to claim 1, wherein said illuminating step comprises illuminating the target material with a plurality of elliptical beams.

10. A method according to claim 9, wherein each of the plurality of elliptical beams has substantially equal linear power density.

11. An apparatus for depositing a target material on a deposition substrate comprising:
   (a) means for producing a laser beam;
   (b) a beam-separating lens comprising:
      (i) a first substantially flat surface; and
      (ii) a second concave surface opposite said first surface comprising a conic section having a cone angle relative to said first surface; and
   (c) means for focusing a laser beam on the target material;
   wherein said beam-separating lens is positioned between said laser beam-producing means and said focusing means.

12. An apparatus according to claim 11, wherein said beam-separating lens further comprises at least one concentric ring angled relative to said first surface and having a steeper pitch relative to said first surface than the cone angle of said conic section.

13. An apparatus according to claim 11, wherein said at least one concentric ring comprises a plurality of concentric rings, each of which has an inner diameter, and each of which is angled relative to said first surface at a steeper pitch than the core angle of said conic section and any of said plurality of concentric rings within its inner diameter.

14. An apparatus according to claim 11, wherein said focusing means comprises a positive lens.

15. An apparatus according to claim 14, which further comprises means for securing the target material, said target securing means being positioned so that the distance between said positive lens and the target material is substantially equal to the focal length of said positive lens.

16. An apparatus according to claim 11, wherein said means for producing a laser beam comprises means for producing a beam having radially symmetric intensity about its laser axis.

17. An apparatus according to claim 11, further comprising a lens for altering the ellipsicity of a laser beam positioned so that said beam-separating lens is between said laser beam-producing means and said ellipsicity-altering lens.

18. An apparatus according to claim 17, wherein said ellipsicity-altering lens is a cylindrical lens.

19. An apparatus according to claim 17, wherein said focusing means is a spheroidal-cylindrical lens.

20. An apparatus according to claim 15, further comprising means for supporting the deposition substrate.

21. An apparatus according to claim 20, wherein said means for supporting the deposition substrate is positioned between said focusing means and said target substrate securing means, and wherein said means for providing a laser beam is positioned so that the path of the laser beam produced thereby is normal to the target substrate.

22. An apparatus according to claim 14, wherein said positive lens is positioned so that its longitudinal axis is tilted relative to said flat surface of said beam separating lens so that a substantially circular illumination pattern is produced at the target material.

* * * * *

UNITED STATES PATENT AND TRADEMARK OFFICE
CERTIFICATE OF CORRECTION

PATENT NO. : 5,405,659

DATED : April 11, 1995

INVENTOR(S) : Fernandez

It is certified that error appears in the above-identified patent and that said Letters Patent is hereby corrected as shown below:

<u>Column 2</u> line 5, after "plume." insert a space.

<u>Column 7</u> line 20, "Φ" should be --$\phi$--;
line 60, "Φ" should be --$\phi$--.

<u>Column 8</u> line 62, "Φ" should be --$\phi$--.

<u>Column 11</u> formula 3, the superscript "$-2(\frac{r}{2})2$" should be ---$2(\frac{r}{w})^2$--;
line 31, delete the space between "2" and "w";

UNITED STATES PATENT AND TRADEMARK OFFICE
CERTIFICATE OF CORRECTION

PATENT NO. : 5,405,659
DATED : April 11, 1995
INVENTOR(S) : Fernandez

It is certified that error appears in the above-indentified patent and that said Letters Patent is hereby corrected as shown below:

line 33, after "to" insert --°°--.

Signed and Sealed this

Twenty-fourth Day of October, 1995

Attest:

BRUCE LEHMAN

Attesting Officer          Commissioner of Patents and Trademarks